US010033429B2

(12) United States Patent
Wu

(10) Patent No.: US 10,033,429 B2
(45) Date of Patent: Jul. 24, 2018

(54) SIGNAL TRANSMITTING CIRCUIT

(71) Applicant: MONTAGE TECHNOLOGY (SHANGHAI) CO., LTD., Shanghai (CN)

(72) Inventor: Zixin Wu, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/637,623

(22) Filed: Jun. 29, 2017

(65) Prior Publication Data
US 2018/0167101 A1 Jun. 14, 2018

(30) Foreign Application Priority Data
Dec. 14, 2016 (CN) .......................... 2016 1 1152253

(51) Int. Cl.
*H04B 3/32* (2006.01)
*H04B 1/525* (2015.01)
*H04B 3/23* (2006.01)
*H04L 25/02* (2006.01)

(52) U.S. Cl.
CPC .............. *H04B 1/525* (2013.01); *H04B 3/23* (2013.01); *H04B 3/32* (2013.01); *H04L 25/0278* (2013.01); *H04L 25/0292* (2013.01)

(58) Field of Classification Search
CPC ...... H04B 3/32; H04J 1/12; H04J 3/10; G06F 13/40; H04L 25/14
USPC ................................................. 375/295, 296
See application file for complete search history.

(56) References Cited

U.S. PATENT DOCUMENTS

| 7,164,648 | B1 * | 1/2007 | Bachar | H04B 3/32 370/201 |
| 8,543,954 | B1 * | 9/2013 | Keller | G06F 17/5031 703/14 |
| 8,595,669 | B1 * | 11/2013 | Keller | G06F 17/5036 716/106 |
| 9,673,862 | B1 * | 6/2017 | Gines | H04B 3/487 |
| 9,781,254 | B1 * | 10/2017 | Anim-Appiah | H04M 3/34 |
| 2002/0008561 | A1 * | 1/2002 | Lin | H01L 23/5222 327/296 |

(Continued)

FOREIGN PATENT DOCUMENTS

WO  WO 2010002553 A1 * 1/2010 ............... H04B 3/32

OTHER PUBLICATIONS

P. Livshits and S. Sofer, "Aggravated Electromigration of Copper Interconnection Lines in ULSI Devices Due to Crosstalk Noise," in IEEE Transactions on Device and Materials Reliability, vol. 12, No. 2, pp. 341-346, Jun. 2012.*

*Primary Examiner* — Chieh M Fan
*Assistant Examiner* — Berhanu Tadese
(74) *Attorney, Agent, or Firm* — Oliff PLC

(57) ABSTRACT

Disclosed is a signal transmitting circuit, a retiming unit is connected with an aggressor signal line to output a previous moment signal and a current moment signal, a control signal associated with the previous moment signal and the current moment signal is output to a crosstalk compensation circuit through a logic circuit, the crosstalk compensation circuit receives a signal from a victim signal line, so as to dynamically change delays corresponding to different transmission modes in combination with inputs of the victim signal line and the aggressor signal line.

18 Claims, 5 Drawing Sheets

(56) References Cited

U.S. PATENT DOCUMENTS

| | | | | |
|---|---|---|---|---|
| 2005/0030884 | A1* | 2/2005 | Kim | H04B 3/23 370/201 |
| 2005/0259692 | A1* | 11/2005 | Zerbe | H04L 25/14 370/503 |
| 2006/0215792 | A1* | 9/2006 | Murugan | H04B 3/32 375/343 |
| 2007/0064923 | A1* | 3/2007 | Schmukler | H03H 11/265 379/406.1 |
| 2007/0275607 | A1* | 11/2007 | Kwark | H05K 1/0216 439/676 |
| 2008/0198909 | A1* | 8/2008 | Tsatsanis | H04B 3/32 375/219 |
| 2008/0215650 | A1* | 9/2008 | Tsatsanis | H04B 3/32 708/203 |
| 2010/0327922 | A1* | 12/2010 | Ando | G11C 7/1051 327/141 |
| 2013/0147547 | A1* | 6/2013 | Nalawade | G06F 17/5063 327/551 |
| 2016/0119024 | A1* | 4/2016 | Muljono | H04B 3/32 370/201 |

* cited by examiner

SIGNAL TRANSMITTING CIRCUIT

BACKGROUND OF THE PRESENT INVENTION

Field of Invention

The present invention relates to the technical field of circuit design, in particular to crosstalk cancellation circuit design.

Description of Related Arts

Crosstalk occurs on high-speed signal lines of packages, circuit boards, various plug-ins or interfaces, and influences signal propagation delay and signal quality. In order to compensate the crosstalk, a crosstalk compensation circuit is designed in the signal transmitting path in a chip. However, the previous crosstalk compensation circuit in a transmitting terminal generally needs to prejudge that whether a transmission mode between an aggressor signal line and a victim signal line is an odd mode (i.e., transmission signals are opposite in phase) or an even mode (i.e., transmission signals are same in phase) before design, then a crosstalk compensation circuit is implemented according to the judgment result and a corresponding delay is added or subtracted in the signal path to match with the mode judgment result, which results in a relatively complex circuit as a whole, as well as a greater signal transmission delay or additional power consumption eventually.

SUMMARY OF THE PRESENT INVENTION in view of the above-mentioned disadvantages in the prior art, an object of the present invention is to provide a signal transmitting circuit, which dynamically provides a delay corresponding to different transmission modes through a crosstalk compensation circuit in combination with inputs of an aggressor signal line and a victim signal line, has simple structure and solves the problem that previously mentioned.

In order to realize the above-mentioned object and other related objects, the present invention provides a signal transmitting circuit, comprising: a victim signal line and at least one aggressor signal line; a retiming unit having an input terminal connected with the aggressor signal line for receiving a first input signal from the aggressor signal line, a first output terminal for outputting a current moment signal from the aggressor signal line, and a second output terminal for outputting a previous moment signal from the aggressor signal line; a through or inverting unit having a first input terminal tier receiving the current moment signal, a second input terminal for receiving the previous moment signal, at least one first logic signal output terminal and second logic type output terminal, wherein the first logic signal output terminal outputs one of the current moment signal and the previous moment signal, and the second logic type output terminal outputs an inverted signal of the other one of the current moment signal and the previous moment signal; and at least one crosstalk compensation circuit having an input terminal receiving a second input signal from the victim signal line, the crosstalk compensation circuit comprising an input part, a first part and a second part; wherein, the input part comprises a first type of first field effect transistor and a second type of second field effect transistor, with gate electrodes thereof being connected together to form an input terminal for connecting with the victim signal line, and drain electrodes thereof being connected together and further being connected to an output terminal of the crosstalk compensation circuit; the first part comprises at least two first branch circuits connected in parallel, each first branch circuit comprises at least one first type of third field effect transistor, a source electrode of the third field effect transistor in each first branch circuit is connected to a first common terminal, the first common terminal is connected to a power source, a drain electrode of the third field effect transistor in each first branch circuit is connected to a second common terminal and the second common terminal is connected to a source electrode of the first field effect transistor; the second part comprises a plurality of second branch circuits connected in parallel, each second branch circuit comprises at least one second type of fourth field effect transistor, a source electrode of the fourth field effect transistor in each second branch circuit is connected to a third common terminal and the third common terminal is grounded; a drain electrode of the fourth field effect transistor in each second branch circuit is connected to a fourth common terminal and the fourth common terminal is connected to a source electrode of the second field effect transistor; wherein gate electrodes of at least a part of the third field effect transistors and the fourth field effect transistors are connected with the first logic signal output terminal, and gate electrodes of the other part of the third field effect transistors and the fourth field effect transistors are connected with the second logic type output terminal.

In one embodiment of the present invention, the first branch circuits correspond to the second branch circuits one to one, the at least one third field effect transistor in the first branch circuit and the at least one fourth field effect transistor in the corresponding second branch circuit are the same in number and connection structure; in the first part and the second part, the gate electrodes of at least a part of the third field effect transistors and the fourth field effect transistors of the same number are connected with the first logic signal output terminal, and the gate electrodes of the other part of the third field effect transistors and the fourth field effect transistors are connected with the second logic type output terminal.

In one embodiment of the present invention, the retiming unit comprises two D flipflops connected in series, wherein an input terminal of a preceding first stage D flipflop receives the first input signal from the aggressor signal line, an output terminal of the preceding first stage D flipflop outputs the current moment signal and an output terminal of a subsequent second stage D flipflop outputs the previous moment signal.

In one embodiment of the present invention, each of a part of the first branch circuits comprises at least two third field effect transistors connected in series; a gate electrode of one of the at least two third field effect transistors connected in series is connected with the first logic signal output terminal, and a gate electrode of the other one of the at least two third field effect transistors connected in series is connected with the second logic type output terminal.

In one embodiment of the present invention, the crosstalk compensation circuit further comprises: at least one third branch circuit, the third branch circuit having at least one pair of delay elements, each pair of delay elements including a first delay element and a second delay element respectively, wherein one end of the first delay element is connected with the first common terminal, the other end of the first delay element is connected with one end of the second delay element and the other end of the second delay element is connected with the fourth common terminal; and at least one pair of a first type of field effect transistor and a second type of field effect transistor, wherein drain electrodes of the first type of field effect transistor and the second type of field effect transistor are connected together and are further connected to the output terminal of the crosstalk compensation circuit, and source electrodes of the first type of field effect transistor and the second type of field effect transistor are connected to a connection point between the first delay element and the second delay element; the first type of field effect transistor and the second type of field effect transistor are capable of being turned on or off simultaneously.

In one embodiment of the present invention, the first delay element and the second delay element are capacitors or field effect transistors.

In one embodiment of the present invention, the first type of field effect transistor is a P-type field effect transistor and the second type of field effect transistor is a N-type field effect transistor, or the first type of field effect transistor is a N-type field effect transistor and the second type of field effect transistor is a P-type field effect transistor.

In one embodiment of the present invention, a delay component is connected between the victim signal line and the input terminal of the crosstalk compensation circuit.

In one embodiment of the present invention, the victim signal line is connected to two-stage crosstalk compensation circuits connected in series; there are at least two aggressor signal which are located at two sides of the victim signal line respectively, wherein one aggressor signal line is connected to one stage of the crosstalk compensation circuits through the retiming unit and the through or inverting unit with which the aggressor signal line is connected, and the other aggressor signal line is connected to the other stage of the crosstalk compensation circuits through the retiming unit and the through or inverting unit with which the aggressor signal line is connected.

In order to realize the above-mentioned object and other related objects, the present invention provides a signal transmitting circuit, comprising: a victim signal line and at least one aggressor signal line; a reaming unit having an input terminal connected with the aggressor signal line for receiving a first input signal from the aggressor signal line, a first output terminal for outputting a current moment signal from the aggressor signal line, and a second output terminal for outputting a previous moment signal from the aggressor signal line; an edge signal generating unit having a first input terminal for receiving the current moment signal, a second input terminal for receiving the previous moment signal, at least one first logic output terminal and second logic type output terminal, so as to acquire a rising edge signal and a falling edge signal which occur in the aggressor signal line according to the current moment signal and the previous moment signal from the aggressor signal line, wherein the first logic signal output terminal is used for outputting an indication value corresponding to the rising edge signal or an inverted signal of the rising edge signal, and the second logic type output terminal is used for outputting an indication value corresponding to the falling edge signal or an inverted signal of the falling edge signal; at least one crosstalk compensation circuit having an input terminal receiving a second input signal from the victim signal line, the crosstalk compensation circuit comprising an input part, a first part and a second part; wherein, the input part comprises a first type of first field effect transistor and a second type of second field effect transistor, with gate electrodes thereof being connected together to form an input terminal for connecting to the victim signal line, and drain electrodes thereof being connected together and further being connected to an output terminal of the crosstalk compensation circuit; the first part comprises at least two first branch circuits connected in parallel, each first branch circuit comprises at least one first type of third field effect transistor, a source electrode of the third field effect transistor in each first branch circuit is connected to a first common terminal, the first common terminal is connected to a power source, a drain electrode of the third field effect transistor in each first branch circuit is connected to a second common terminal and the second common terminal is connected to a source electrode of the first field effect transistor; the second part comprises a plurality of second branch circuits connected in parallel, each second branch circuit comprises at least one second type of fourth field effect transistor, a source electrode of the fourth field effect transistor in each second branch circuit is connected to a third common terminal and the third common terminal is grounded; a drain electrode of the fourth field effect transistor in each second branch circuit is connected to a fourth common terminal and the fourth common terminal is connected to a source electrode of the second field effect transistor; wherein, gate electrodes of at least a part of the third field effect transistors and the fourth field effect transistors are connected with the first logic signal output terminal, and gate electrodes of the other part of the third field effect transistors and the fourth field effect transistors are connected to the second logic type output terminal.

In one embodiment of the present invention, the first branch circuits correspond to the second branch circuits one to one, the at least one third field effect transistor in the first branch circuit and the at least one fourth field effect transistor in the corresponding second branch circuit are the same in number and connection structure; in the first part and the second part, the gate electrodes of at least a part of the third field effect transistors and the fourth field effect transistors of the same number are connected with the first logic signal output terminal, and the gate electrodes of the other part of the third field effect transistors and the fourth field effect transistors are connected with the second logic type output terminal.

In one embodiment of the present invention, the retiming unit comprises two D flipflops connected in series, wherein an input terminal of a preceding first stage D flipflop receives the first input signal from the aggressor signal line, an output terminal of the preceding first stage D flipflop outputs the current moment signal and an output terminal of a subsequent second stage D flipflop outputs the previous moment signal.

In one embodiment of the present invention, the edge signal generating unit comprises an AND circuit and an NAND circuit; the current moment signal and an inverted signal of the previous moment signal are input to two input terminals of the AND circuit respectively, an inverted signal of the current moment signal and the previous moment signal are input to two input terminals of the NAND circuit respectively, an output terminal of the AND circuit is the first logic signal output terminal and an output terminal of the NAND circuit is the second logic type output terminal; or the inverted signal of the current moment signal and the previous moment signal are input to the two input terminals of the AND circuit respectively the current moment signal and the inverted signal of the previous moment signal are input to the two input terminals of the NAND circuit respectively, the output terminal of the AND circuit is the second logic type output terminal and the output terminal of the NAND circuit is the first logic signal output terminal.

In one embodiment of the present invention, the crosstalk compensation circuit further comprises: at least one third branch circuit, the third branch circuit having at least one pair of delay elements, each pair of delay elements including a first delay element and a second delay element respectively, wherein one end of the first delay element is connected with the first common terminal, the other end of the first delay element is connected with one end of the second delay element and the other end of the second delay element is connected with the fourth common terminal; and at least one pair of a first type of field effect transistor and a second type of field effect transistor, wherein drain electrodes of the first type of field effect transistor and the second type of field effect transistor are connected together and are further connected to the output terminal of the crosstalk compensation circuit, and source electrodes of the first type of field effect transistor and the second type of field effect transistor are connected to a connection point between the first delay element and the second delay element; the first type of field effect transistor and the second type of field effect transistor are capable of being turned on or off simultaneously.

In one embodiment of the present invention, the first delay element and the second delay element are capacitors or field effect transistors.

In one embodiment of the present invention, the first type of field effect transistor is a P-type field effect transistor and the second type of field effect transistor is a N-type field effect transistor, or the first type of field effect transistor is a N-type field effect transistor and the second type of field effect transistor is a P-type field effect transistor.

In one embodiment of the present invention, a delay component is connected between the victim signal line and the input terminal of the crosstalk compensation circuit.

In one embodiment of the present invention, the victim signal line is connected to two-stage crosstalk compensation circuits connected in series; there are at least two aggressor signal lines, Which are located at two sides of the victim signal line respectively, wherein one aggressor signal line is connected to one stage of the crosstalk compensation circuits through the retiming unit and the edge signal generating unit with which the aggressor signal line is connected, and the other aggressor signal line is connected to the other stage of the crosstalk compensation circuits through the retiming unit and the edge signal generating unit with which the aggressor signal line is connected.

As described above, in the signal transmitting circuit in accordance with the present invention, the retiming unit is connected with the aggressor signal line to output the previous moment signal and the current moment signal, the control signal associated with the previous moment signal and the current moment signal is output to the crosstalk compensation circuit through the logic circuit, and the crosstalk compensation circuit receives the signal from the victim signal line, so as to dynamically change delays corresponding to different transmission modes in combination with inputs of the victim signal line and the aggressor signal line.

DETAILED DESCRIPTION OF THE PREFERRED EMBODIMENTS

The embodiments of the present invention will be described below through specific embodiments. One skilled in the art may easily understand other advantages and effects of the present invention according to contents disclosed in the description. The present invention may also be implemented or applied through other different specific embodiments. Various modifications or variations may also be made to all details in the description based on different points of view and applications without departing from the spirit of the present invention. It needs to be stated that the following embodiments and the features in the embodiments may be mutually combined under the situation of no conflict.

It needs to be stated that the drawings provided in the following embodiments are just used for exemplarily describing the basic concept of the present invention, thus the drawings only illustrate related components in the present invention and are not drawn according to component number, shape and size during actual implementation, the configuration, number and scale of each component during actual application may be freely changed and the layout configurations of the components may be more complex.

First Embodiment

Figure 1:
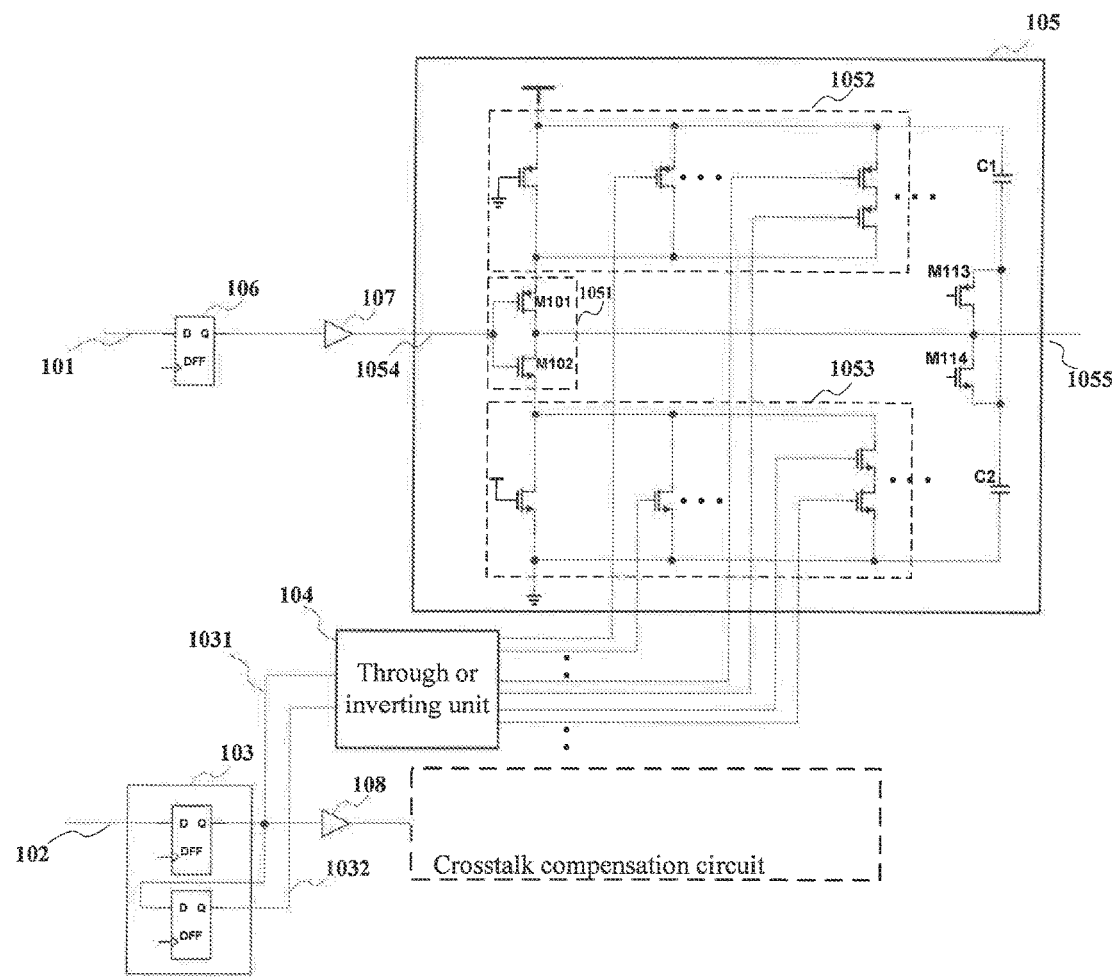
FIG. 1 illustrates a circuit schematic diagram of a signal transmitting circuit according to a first embodiment of the present invention.

As illustrated in FIG. 1, the signal transmitting circuit comprises: a victim signal line 101, at least one aggressor signal line 102, a retiming unit 103, a through or inverting unit 104 and at least one crosstalk compensation circuit 105.

The retiming unit 103 has an input terminal connected with the aggressor signal line 102 for receiving a first input signal from the aggressor signal line 102, the retiming unit 103 further has a first output terminal 1031 for outputting a current moment signal from the aggressor signal line 102 and a second output terminal 1032 for outputting a previous moment signal from the aggressor signal line 102.

Specifically, the retiming unit 103 comprises two D flipflops connected in series and using synchronous clock signals, wherein an input terminal of a preceding first stage D flipflop receives the first input signal from the aggressor signal line 102, an output terminal of the preceding first stage D flipflop is led out to the first output terminal 1031, an input terminal of a subsequent second stage D flipflop is connected with the output terminal of the first stage D flipflop and an output terminal of the second stage D flipflop is led out to the second output terminal 1032.

A working principle thereof is as follow: since an output of a D flipflop changes only in, for example, a rising edge of a clock signal (it needs to be stated that the rising edge is taken as an example in this embodiment, it may also be a falling edge in other embodiments, and all D flipflops in a circuit are generally unified to be in a same edge signal flipflop mode), when the rising edge of the clock signal comes, a changed signal of an output signal of the preceding first stage D flipflop is denoted as the current moment signal, and the input (terminal D) of the subsequent second stage D flipflop comes from the output (terminal Q) of the preceding first stage D flipflop; since the output of the first stage D flipflop is slightly later than the coming moment of the rising edge of the clock signal due to a component delay and the first stage D flipflop and the second stage D flipflop adopt the synchronous clock signals, the input of the second stage D flipflop, when the rising edge of the clock signal arrives, is still the output of the first stage D flipflop before change, and the output of the second stage D flipflop corresponds to the previous moment signal of the current moment signal.

For example, when the rising edge of the clock signal arrives, the output of the preceding first stage D flipflop is changed from "1" to "0", the output is then transmitted to the first output terminal 1031 and reaches the input terminal of the subsequent D flipflop, while the subsequent D flipflop outputs "1" and the output is transmitted to the second output terminal 1032.

Correspondingly, the victim signal line 101 is connected to the crosstalk compensation circuit 105 through a D flipflop 106, so as to synchronize with signal transmission of the aggressor signal line.

The through or inverting unit 104 receives the inputs of the current moment signal and the previous moment signal and at least has two types of output terminals, i.e., a first logic type output terminal and a second logic type output terminal, wherein the first logic type output terminal outputs one of the current moment signal and the previous moment signal, while the second logic type output terminal outputs an inverted signal of the other one of the current moment signal and the previous moment signal. For example, the first logic type output terminal outputs the current moment signal from the aggressor signal line while the second logic type output terminal outputs an inverted signal of the previous moment signal from the aggressor signal line.

The crosstalk compensation circuit 105 comprises an input part 1051, a first part 1052 and a second part 1053.

The input part 1051 comprises a first type of first field effect transistor M101 and a second type of second field effect transistor M102, gate electrodes of both the first type of first field effect transistor and the second type of second field effect transistor are connected to form an input terminal for connecting with the victim signal line 101, drain electrodes of both the first type of first field effect transistor and the second type of second field effect transistor are connected together and are further connected with an output terminal 1055 of the crosstalk compensation circuit 105 for connecting with a next stage circuit, wherein the first type of field effect transistor and the second type of field effect transistor are one and the other one of P-type field elect transistor and N-type field effect transistor respectively.

In this embodiment, the first type of field effect transistor is the P-type field effect transistor and the second type of field effect transistor is the N-type field effect transistor. However, one skilled in the art may make variations according to actual needs, and it is not limited thereto.

The first part 1052 comprises at least two first branch circuits connected in parallel, each first branch circuit comprises at least one first type of third field effect transistor, a source electrode of the third field effect transistor in each first branch circuit is connected to a first common terminal, the first common terminal is connected to a power source, a drain electrode of the third field effect transistor in each first branch circuit is connected to a second common terminal and the second common terminal is connected to a source electrode of the first field effect transistor M101.

Alternatively, the third field effect transistor in the at least one first branch circuit is always turned on. For example, a gate electrode of a PMOS transistor is grounded. In addition, each of the other first branch circuits may comprise one third field effect transistor or at least two third field effect transistors connected in series (a source electrode of one third field effect transistor is connected with a drain electrode of the other third field effect transistor), and the number of the first branch circuits may be varied according to a delay range which needs to be adjusted.

The second part 1053 comprises a plurality of second branch circuits connected in parallel, each second branch circuit comprises at least one second type of fourth field effect transistor, a source electrode of the fourth field effect transistor in each second branch circuit is connected to a third common terminal and the third common terminal is grounded; a drain electrode of the fourth field effect transistor in each second branch circuit is connected to a fourth common terminal and the fourth common terminal is connected to a source electrode of the second field effect transistor.

Alternatively, the fourth field effect transistor in the at least one second branch circuit is always turned on. For example, a gate electrode of a NMOS transistor is connected with a high level. In addition, each of the other second branch circuits may comprise one fourth field effect transistor or at least two fourth field effect transistors connected in series (a source electrode of one fourth field effect transistor is connected to a drain electrode of the other fourth field effect transistor), and the number of the second branch circuits may be varied according to a delay range which needs to be adjusted.

Alternatively, gate electrodes of at least a part of the third field effect transistors and the fourth transistors are connected with the first logic type output terminal, and are controlled to be turned on or off by the current moment signal from the aggressor signal line 102; gate electrodes of the other part of the third field effect transistors and the fourth field effect transistors are connected with the second logic type output terminal, and are controlled to be turned on or off by the inverted signal of the previous moment signal from the aggressor signal line 102.

Alternatively, the second part 1053 and the first part 1052 are structurally symmetrical, Specifically, the first branch circuits correspond to the second branch circuits one to one, the at least one third field effect transistor in the first branch circuit and the at least one fourth field effect transistor in the second branch circuit are the same in number and connection structure. In the first part 1052 and the second part 1053, gate electrodes of at least a part of the third field effect transistors and the fourth field effect transistors of the same number are connected with the first output terminal 1031 of the retiming unit 103, and gate electrodes of the other part of the third field effect transistors and the fourth field effect transistors are connected with the second output terminal 1032 of the retiming unit 103. Of course, in other situations, the first part 1052 and the second part 1053 may also be structurally asymmetrical.

The input terminal of the crosstalk compensation circuit 105 receives from the victim signal line 101 a second input signal which has passed through the D flipflop 106. In this example, preferably, the victim signal line 101 may be subsequently connected with the D flipflop 106, a delay component 107 and an input terminal 1054 of the crosstalk compensation circuit 105 in sequence, such that the signal from the victim signal line 101 reaches the crosstalk compensation circuit 105 after passing through the D flipflop 106 and the delay component 107, and the output signal from the D flipflop 106 reaches the crosstalk compensation circuit 105 earlier than the output signal from the through or inverting unit 104 reaches the crosstalk compensation circuit 105 due to the delay component 107, such that the current moment signal and the inverted signal of the previous moment signal can reach the crosstalk compensation circuit 105 prior to the signal from the victim signal line 101, and therefore the signal from the victim signal line 101 is guaranteed to be correctly output. In one example, the delay component 107 may be, for example, a data buffer.

Alternatively, the crosstalk compensation circuit 105 may further comprise at least one third branch circuit, the third branch circuit has at least one pair of delay elements, and the pair of delay elements includes a first delay element C1 and a second delay element C2 respectively, wherein one end of the first delay element C1 is connected with the first common terminal to connect to a power source, the other end of the first delay element C1 is connected with one end of the second delay element C2 and the other end of the second delay element C2 is connected to the fourth common terminal to be grounded. In one example, the first delay element C1 and the second delay element C2 may be capacitors and may also be field effect transistors or other elements.

Moreover, the crosstalk compensation circuit 105 may further comprise at least one pair of a first type of field effect transistor M113 and a second type of field effect transistor M114, wherein drain electrodes of the first type of field effect transistor M113 and the second type of field effect transistor M114 are connected together and are further connected to the output terminal 1055 of the crosstalk compensation circuit 105, source electrodes of the first type of field effect transistor M113 and the second type of field effect transistor M114 are connected to a connection signal line between the first delay element C1 and the second delay element C2; a desired voltage can be applied to gate electrodes of the first type of field effect transistor M113 and the second type of field effect transistor M114, such that the first type of field effect transistor M113 and the second type of field effect transistor M114 are capable of being turned on or off simultaneously, and thereby the adjustable delay range of the crosstalk compensation circuit 105 is further increased.

As described above, the numbers of the first branch circuits and the second branch circuits and the numbers of the third field effect transistors and the fourth field effect transistors are not limited by the drawings, and may be increased according to actual needs to adjust the delay range.

The above-mentioned aggressor signal line 102 and the victim signal line 101 are relative in identities, the aggressor signal line 102 may be a victim signal line of an another signal line and the victim signal line 101 may also be an aggressor signal line of an another signal line.

Therefore, alternatively, the first output terminal 1031 of the retiming unit 103 with which the aggressor signal line 102 is connected may also be connected with a crosstalk compensation circuit after a delay component 108 (e.g., a data buffer) to adjust the signal delay thereof; the D flipflop 106 with which the victim signal line 101 is connected may also comprise two D flipflops connected in series to have the same structure as the retiming unit 103. Such design can satisfy the demands that the signal line has multiple identities (an aggressor signal line and a victim signal line) without modifying the circuit structure.

Figure 2:
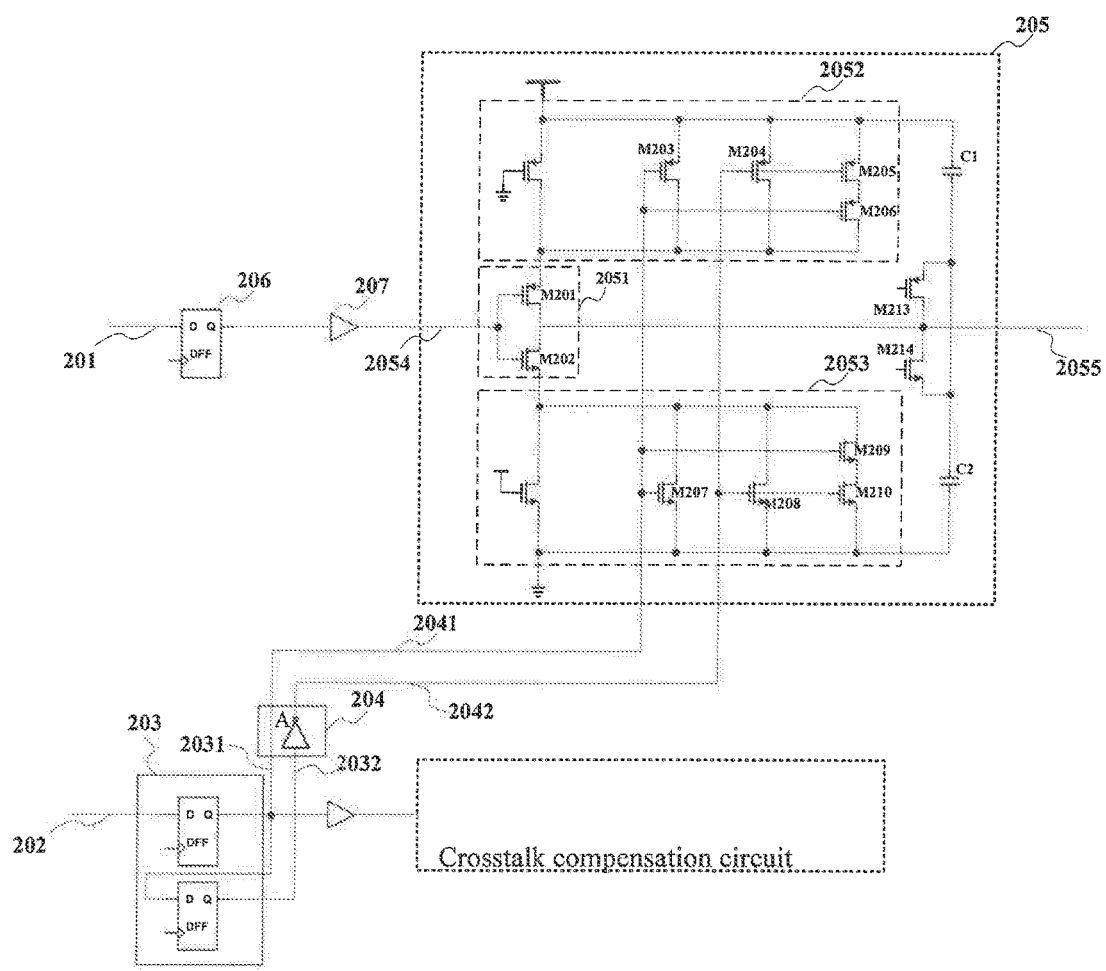
FIG. 2 illustrates a circuit schematic diagram of a signal transmitting circuit according to an example of the first embodiment of the present invention.

One example of the first embodiment in accordance with the present invention will be described below:

As illustrated in FIG. 2, in this example, a through or inverting unit 204 is an implementation structure of the through or inverting unit 104 in FIG. 1, and a first output terminal 2031 of a retiming unit 203 is directly connected with a first logic signal output terminal 2041 to directly output a current moment signal from the first logic type output terminal 2041; the through or inverting unit 204 further comprises an inverter A, which is connected between a second output terminal 2032 of the retiming unit 203 and a second logic type output terminal 2042 to output an inverted signal of a previous moment signal from the second logic type output terminal 2042.

In the case that an aggressor signal line 202 and a victim signal line 201 are in an odd transmission mode. On one hand, supposing that a falling edge (1->0) occurs in a signal of the victim signal line 201, an input terminal 2054 of a crosstalk compensation circuit 205 receives "0" and a M201 is turned on such that a power source is connected with an output terminal 2055 of the crosstalk compensation circuit 205; while a rising edge (0->1) occurs in a signal of the aggressor signal line 202 and the first logic signal output terminal 2031 outputs "1" since an output of a preceding flipflop changes later than a clock edge, a subsequent D flipflop does not receive a hop signal and still outputs "0", the signal is inverted to become "1" which is output to the crosstalk compensation circuit 205 through the second logic type output terminal 2042, at this moment a M203, a M204, a M205 and a M206 in a first part 2052 are all turned off such that the ability for the first part 2052 to transmit a current is weakened, and thereby the delay that the output terminal 2055 of the crosstalk compensation circuit 205 outputs "1" is increased. On the other hand, supposing that a rising edge (0->1) occurs in a signal of the victim signal line 201, the input terminal 2054 of the crosstalk, compensation circuit 205 receives "1", a. M202 is turned on such that the output terminal 2055 of the crosstalk compensation circuit 205 is grounded, a falling edge (1->0) occurs in a signal of the aggressor signal line 202, the first logic signal output terminal 2041 outputs "0", the second logic type output terminal 2042 outputs "0", such that a M207, a M208, a M209 and a M210 in a second part 2053 are all turned off and the ability for the second part 2053 to transmit a current is weakened, and thereby the delay that the output terminal 2055 of the crosstalk compensation circuit 205 outputs "0" is increased.

To sum up, in the odd transmission mode, the crosstalk between corresponding signal lines outside the chip is compensated by increasing the output delay of the signal from the victim signal line 201 in the chip.

In an even mode, derivations may be made similarly. In the case that a falling edge (1->0) occurs in both the signal of the victim signal line 201 and the signal of the aggressor signal line 202, the M201 and all third field effect transistors in the first part 2052 are turned on such that the ability for the first part 2052 to transmit a current is enhanced, and thereby the delay that the output terminal 2055 of the crosstalk compensation circuit 204 outputs "1" is decreased. In the case that a rising edge (0->1) occurs in both the signal of the victim signal line 201 and the signal of the aggressor signal line 202, the M202 and all fourth field effect transistors in the second part 2053 are turned on such that the ability for the second part 2053 to transmit a current is enhanced, and thereby the delay that the output terminal 2055 of the crosstalk compensation circuit 205 outputs "0" is decreased.

In addition, in the case that there is no edge transition in the signal of the aggressor signal line 202, one of the first logic signal output terminal 2041 and the second logic type output terminal 2042 outputs "0" and the other one outputs "1", such that a part of field effect transistors in both the first part 2052 and the second part 2053 are turned on and the other part of field effect transistors are not turned on, as illustrated in FIG. 2. In the case that the first part 2052 and the second part 2053 are structurally symmetrical, regardless of that the first logic signal output terminal 2041 outputs "0" and the second logic type output terminal 2042 outputs "1" or the first logic signal output terminal 2041 outputs "1" and, the second logic type output terminal 2042 outputs "0", to view from the angle of delay, as compared with the odd mode and the even mode, the overall circuit is in a medium-delay state.

Second Embodiment

Figure 3:
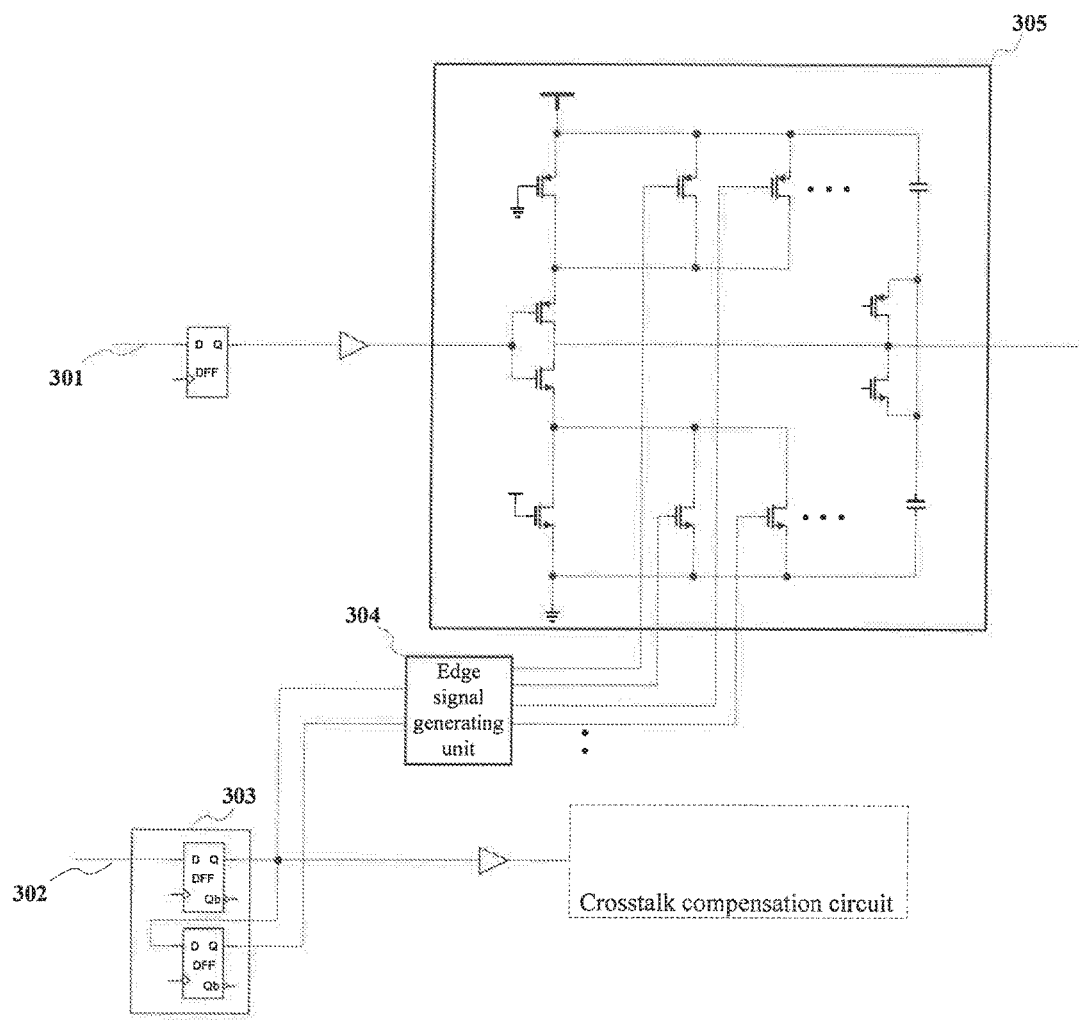
FIG. 3 illustrates a circuit schematic diagram of a signal transmitting circuit according to a second embodiment of the present invention.

As illustrated in FIG. 3, a schematic diagram of a second embodiment of the present invention is illustrated.

The second embodiment differs from the first embodiment mainly in that: in the second embodiment, an edge signal generating unit 304 is used to replace the through or inverting unit for receiving an output of a retiming unit 303; and thus, when a signal edge occurs in an aggressor signal line 302, an indication value corresponding to the signal edge or an inverted signal thereof is obtained through logic processing according to a received current moment signal and a previous moment signal, and the indication value is output to a crosstalk compensation circuit 305 to adjust the delay of a signal from a victim signal line 301.

In this embodiment, since a judgment is only made to the signal edge of the aggressor signal line, the first part and the second part of the crosstalk compensation circuit 305 may not need branch circuits comprising field effect transistors connected in series.

Figure 4:
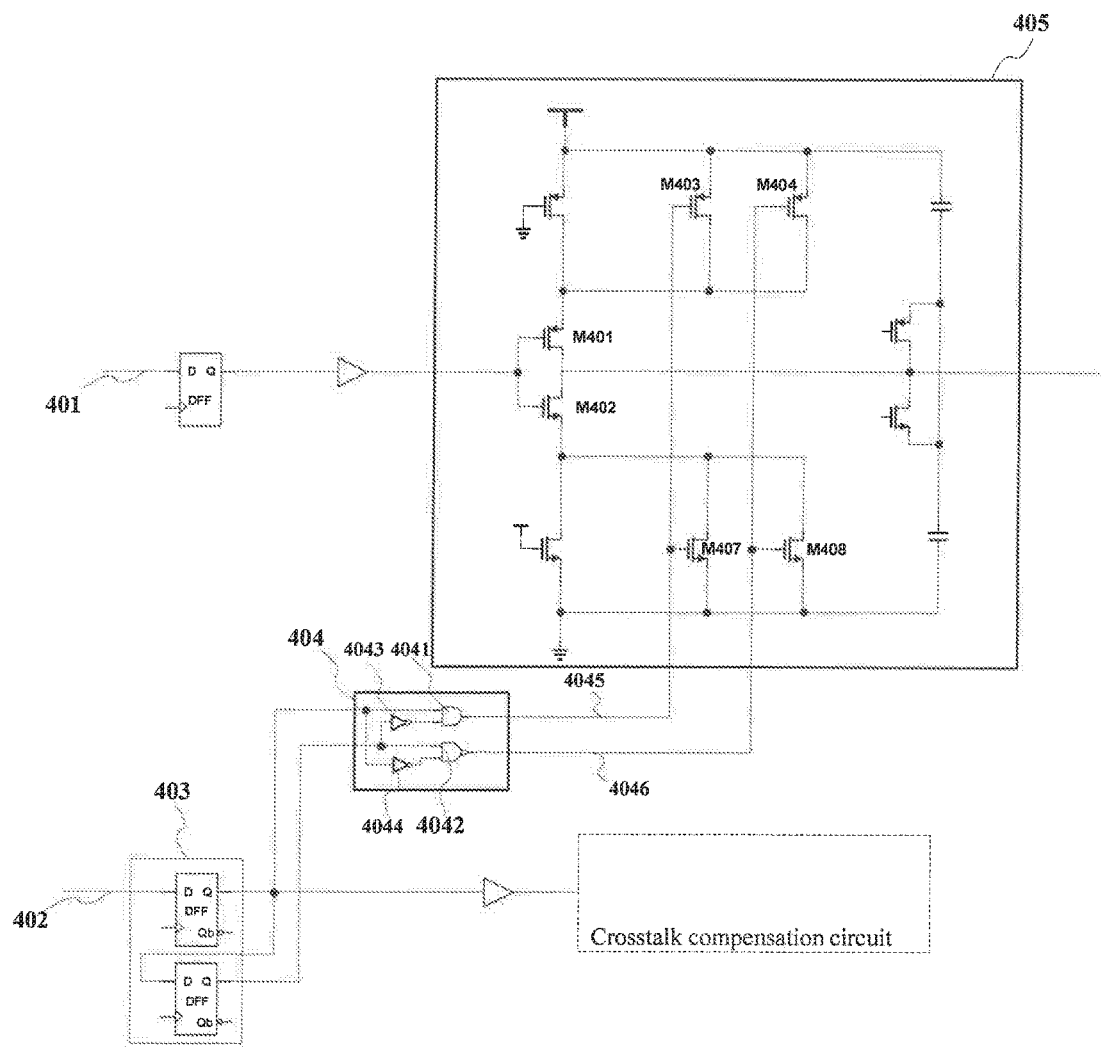
FIG. 4 illustrates a circuit schematic diagram of a signal transmitting circuit according to an example of the second embodiment of the present invention.

A specific example is provided as follow:

As illustrated in FIG. 4, an edge signal generating unit 404 is a specific implementation structure of the edge signal generating unit 304 in FIG. 3, and comprises an AND circuit 4041, a NAND circuit 4042, a first inverter 4043 and a second inverter 4044.

An output terminal (Q) of a first stage D flipflop of a retiming unit 403 is connected with a first input terminal of the AND circuit 4041, an output terminal (Q) of a second stage D flipflop is connected with a second input of the AND circuit 4041 after the first inverter 4043, and an output terminal of the AND circuit 4041 acts as a first logic signal output terminal 4045 and is connected to a crosstalk compensation circuit 405; the output terminal (Q) of the second stage D flipflop is connected to a first input terminal of the NAND circuit 4042, the output terminal of the first stage D flipflop is connected to a second input terminal of the NAND circuit 4042 after the second inverter 4044, and an output terminal of the NAND circuit 4042 acts as a second logic signal output terminal 4046 and is connected to the crosstalk compensation circuit 405.

In FIG. 4, it can be seen that the AND circuit 4041 outputs "1" only in the case that "1" is input into both first input terminal and second input terminal thereof. In this situation, the output terminal of the first stage D flipflop with which the first input terminal of the AND circuit 4041 is connected needs to output "1" which is denoted as a current moment signal of "1", the signal that is input into the second input terminal of the AND circuit 4041 needs to be "1", and it can be deduced that the output terminal of the second stage D flipflop needs to output "0" which is denoted as a previous moment signal of "0" Accordingly, it can be seen that, since the previous moment signal is "0" and the current moment signal is "1" it indicates that a signal rising edge occurs in an aggressor signal line 402, at this moment the two inputs of the NAND circuit 4042 are respectively "0" and "0" the output of the NAND circuit 4042 is "1", first type of field effect transistors M403 and M404 in a first part of the crosstalk compensation circuit 405 are all turned off, and second type of field effect transistors M407 and M408 in a second part of the crosstalk compensation circuit 405 are all turned on; if the mode is an odd mode at this moment, a signal falling edge occurs in a victim signal line 401, a M402 in the input part is turned off, a M401 in the input part is turned on, thereby the delay that the output terminal of the crosstalk compensation circuit 405 outputs "1" is increased; and contrarily, if the mode is an even mode at this moment, a signal rising edge occurs in the victim signal line 401, the M402 in the input part is turned on, the M401 in the input part is turned off, the M407 and the M408 in the second part are turned on, thereby the delay that the output terminal of the crosstalk compensation circuit 405 outputs "0" is decreased.

Then, for the NAND circuit 4042, it outputs "0" only in the case that "1" is input to both first input terminal and second input terminal thereof, and thus the output terminal of the second stage D flipflop with which the first input terminal of the NAND circuit 4042 is connected needs to output "1" which is denoted as a previous moment signal of "1"; the output terminal of the first stage D flipflop needs to output "0" which is denoted as a current moment signal of "0"; since the previous moment signal is "1" and the current moment signal indicates that a signal falling edge occurs in the signal of the aggressor signal line 402, while at this moment the output of the AND circuit 4041 is "0", the M403 and the M404 are turned on, and the M407 and the M408 are turned off; if the mode is an odd mode at this moment, a rising edge occurs in the signal of the victim signal line 401, the M401 is turned off and the M402 is turned on, thereby the delay that the crosstalk compensation circuit 405 outputs "0" is increased; and if the mode is an even mode at this moment, a falling edge occurs in the signal of the victim signal line 401, the M401 is turned on and the M402 is turned off, thereby the delay that the crosstalk compensation circuit 405 outputs "1" is decreased.

In the case that there is no signal edge occurred in the aggressor signal, one of the two output terminals of the edge signal generating unit 404 outputs "0" and the other one outputs "1" such that the crosstalk compensation circuit 405 is kept in a medium-delay state.

It needs to be stated that the first inverter 4043 and the second inverter 4044 are not indispensable, the inverted signal of the current moment signal from the aggressor signal may also be acquired from an inversion output terminal (Qb) of the first stage D flipflop, the inverted signal of the previous moment signal from the aggressor signal may also be acquired from an inversion output terminal of the second stage D flipflop, and the above-mentioned embodiments are not limited thereto.

In some embodiments, the first logic output terminal may also output an indication value corresponding to an inverted signal of a rising edge, i.e., the first logic output terminal outputs "0" which represents that the rising edge of the aggressor signal comes, and the first logic output terminal outputs "1" which represents that no rising edge occurs in the aggressor signal (i.e., the signal from the aggressor signal line is continuously "0" or "1" or a falling edge occurs).

In some embodiments, the second logic output terminal may also output an indication value corresponding to an inverted signal of a falling edge, i.e., the second logic output terminal outputs "1" which represents that the falling edge of the aggressor signal comes, and the second logic output terminal outputs "0" which represents that no falling edge occurs in the aggressor signal (i.e., the signal from the aggressor signal line is continuously "0" or "1" or a rising edge occurs).

Derivations may be made based on the above-mentioned embodiment, when there is a plurality of logic output terminals of the edge signal generating unit (e.g., 4, 5, 8, etc.), group outputs of indication values corresponding to edge signals and inverted signals of the edge signals in various combinations can be realized.

Third Embodiment

Figure 5:
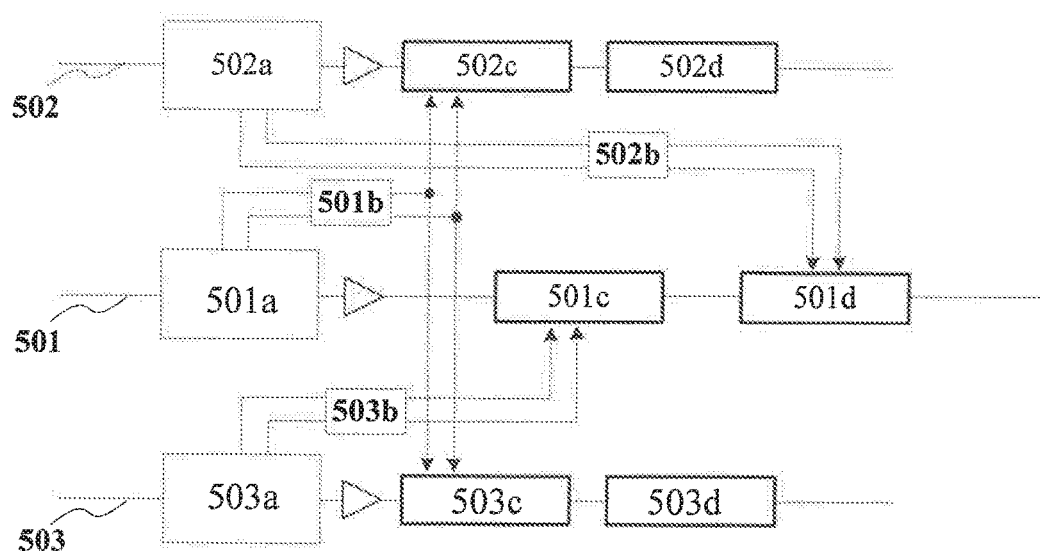
FIG. 5 illustrates a circuit schematic diagram of a signal transmitting circuit according to a third embodiment of the present invention.

As illustrated in FIG. 5, the present invention further provides a third embodiment. The signal transmitting circuits in both the first embodiment and the second embodiment can be applied to this embodiment.

There are two aggressor signal lines 502 and 503, which are located at two sides of a victim signal line 501 respectively.

The victim signal line 501 is connected with two-stage crosstalk compensation circuits, i.e., 501c and 501d connected in series.

The aggressor signal line 502 is connected with a retiming unit 502a, the retiming unit 502a outputs a current moment signal and a previous moment signal to a logic unit 502b (which is, for example, the through or inverting unit or the edge signal generating unit in the above-mentioned examples), the logic unit 502b is connected with the crosstalk compensation circuit 501d, and the crosstalk compensation circuit 501d adjusts the delay of the signal from the victim signal line 501 according to a signal transmission mode between the victim signal line 501 and the aggressor signal line 502.

The aggressor signal line 503 is connected with a retiming unit 503a, the retiming unit 503a outputs a current moment signal and a previous moment signal to a logic unit 503b (which is, for example, the through or inverting unit or the edge signal generating unit in the above-mentioned examples), the logic unit 503b is connected with the crosstalk compensation circuit 501c, and the crosstalk compensation circuit 501c adjusts the delay of the signal from the victim signal line 501 according to a signal transmission mode between the victim signal line 501 and the aggressor signal line 503.

The signal from the victim signal line 501 may also be an aggressor signal for the aggressor signal lines 502 and 503. Therefore, alternatively, the aggressor signal line 502 may be connected with at least one crosstalk compensation circuit after the retiming unit 502a, However, in consideration of that signal lines at two sides of the aggressor signal line 502 may be aggressor signal lines for the aggressor signal line 502 itself, two-stage crosstalk compensation circuits may be arranged, e.g., crosstalk compensation circuits 502c and 502d as illustrated in FIG. 5, Similarly, the aggressor signal line 503 may also be connected with two-stage crosstalk compensation circuits 503c and 503d. A retiring unit 501a outputs the current moment signal and the previous moment signal from the victim signal line 501 to a logic unit 501b (which is, for example, the through or inverting unit or the edge signal generating unit in the above-mentioned examples), and the logic unit 501b is respectively connected to the crosstalk compensation circuits 502c and 503c such that the crosstalk compensation circuit 502c adjusts the delay of the signal from the aggressor signal line 502 and the crosstalk compensation circuit 503c adjusts the delay of the signal from the aggressor signal line 503.

To sum up, in the signal transmitting circuit in accordance with the present invention, the retiming unit is connected with the aggressor signal line to output the previous moment signal and the current moment signal, the control signal associated with the previous moment signal and the current moment signal is output to the crosstalk compensation circuit through the logic circuit, and the crosstalk compensation circuit receives the signal from the victim signal line, so as to dynamically change delays corresponding to different transmission modes in combination with inputs of the victim signal line and the aggressor signal line.

The present invention effectively overcomes various disadvantages in the prior art and thus has a great industrial utilization value.

The above-mentioned embodiments are just used for exemplarily describing the principle and effects of the present invention instead of limiting the present invention. One skilled in the art may make modifications or variations to the above-mentioned embodiments without departing from the spirit and scope of the present invention. Therefore, all equivalent modifications or variations made by one skilled in the art without departing from the spirit and technical concept disclosed by the present invention shall be still covered by the claims of the present invention.

What is claimed is:

1. A signal transmitting circuit comprising:
a victim signal line and at least one aggressor signal line;
a retiming unit having an input terminal connected with the aggressor signal line for receiving a first input signal from the aggressor signal line, a first output terminal for outputting a current moment signal from the aggressor signal line, and a second output terminal for outputting a previous moment signal from the aggressor signal line;
a through or inverting unit having a first input terminal for receiving the current moment signal, a second input terminal for receiving the previous moment signal, at least one first logic signal output terminal and second logic type output terminal, wherein the first logic signal output terminal outputs one of the current moment signal and the previous moment signal, and the second logic type output terminal outputs an inverted signal of the other one of the current moment signal and the previous moment signal; and
at least one crosstalk compensation circuit having an input terminal receiving a second input signal from the victim signal line, the crosstalk compensation circuit comprising an input part, a first part and a second part;
wherein, the input part comprises a first type of first field effect transistor and a second type of second field effect transistor, with gate electrodes thereof being connected together to form an input terminal for connecting with the victim signal line, and drain electrodes thereof being connected together and further being connected to an output terminal of the crosstalk compensation circuit; the first part comprises at least two first branch circuits connected in parallel, each first branch circuit comprises at least one first type of third field effect transistor, a source electrode of the third field effect transistor in each first branch circuit is connected to a first common terminal, the first common terminal is connected to a power source, a drain electrode of the third field effect transistor in each first branch circuit is connected to a second common terminal and the second common terminal is connected to a source electrode of the first field effect transistor; the second part comprises a plurality of second branch circuits connected in parallel, each second branch circuit comprises at least one second type of fourth field effect transistor, a source electrode of the fourth field effect transistor in each second branch circuit is connected to a third common terminal and the third common terminal is grounded; a drain electrode of the fourth field effect transistor in each second branch circuit is connected to a fourth common terminal and the fourth common terminal is connected to a source electrode of the second field effect transistor;

wherein gate electrodes of at least a part of the third field effect transistors and the fourth field effect transistors are connected with the first logic signal output terminal, and gate electrodes of the other part of the third field effect transistors and the fourth field effect transistors are connected with the second logic type output terminal.

2. The signal transmitting circuit according to claim 1, wherein the first branch circuits correspond to the second branch circuits one to one, the at least one third field effect transistor in the first branch circuit and the at least one fourth field effect transistor in the corresponding second branch circuit are the same in number and connection structure; in the first part and the second part, the gate electrodes of at least a part of the third field effect transistors and the fourth field effect transistors of the same number are connected with the first logic signal output terminal, and the gate electrodes of the other part of the third field effect transistors and the fourth field effect transistors are connected with the second logic type output terminal.

3. The signal transmitting circuit according to claim 1, wherein the retiring unit comprises two D flipflops connected in series, wherein an input terminal of a preceding first stage D flipflop receives the first input signal from the aggressor signal line, an output terminal of the preceding first stage D flipflop outputs the current moment signal and an output terminal of a subsequent second stage D flipflop outputs the previous moment signal.

4. The signal transmitting circuit according to claim 1, wherein each of a part of the first branch circuits comprises at least two third field effect transistors connected in series; a gate electrode of one of the at least two third field effect transistors connected in series is connected with the first logic signal output terminal, and a gate electrode of the other one of the at least two third field effect transistors connected in series is connected with the second logic type output terminal.

5. The signal transmitting circuit according to claim 1, wherein the crosstalk compensation circuit further comprises:
at least one third branch circuit, the third branch circuit having at least one pair of delay elements, each pair of delay elements including a first delay element and a second delay element respectively, wherein one end of the first delay element is connected with the first common terminal, the other end of the first delay element is connected with one end of the second delay element and the other end of the second delay element is connected with the fourth common terminal; and
at least one pair of a first type of field effect transistor and a second type of field effect transistor, wherein drain electrodes of the first type of field effect transistor and the second type of field effect transistor are connected together and are further connected to the output terminal of the crosstalk compensation circuit, and source electrodes of the first type of field effect transistor and the second type of field effect transistor are connected to a connection point between the first delay element and the second delay element; the first type of field effect transistor and the second type of field effect transistor are capable of being turned on or off simultaneously.

6. The signal transmitting circuit according to claim 1, wherein the first delay element and the second delay element are capacitors or field effect transistors.

7. The signal transmitting circuit according to claim 1, wherein the first type of field effect transistor is a P-type field effect transistor and the second type of field effect transistor is a N-type field effect transistor, or the first type of field effect transistor is a N-type field effect transistor and the second type of field effect transistor is a P-type field effect transistor.

8. The signal transmitting circuit according to claim 1, wherein a delay component is connected between the victim signal line and the input terminal of the crosstalk compensation circuit.

9. The signal transmitting circuit according to claim 1, wherein the victim signal line is connected to two-stage crosstalk compensation circuits connected in series; there are at least two aggressor signal lines, which are located at two sides of the victim signal line respectively, wherein one aggressor signal line is connected to one stage of the crosstalk compensation circuits through the retiming unit and the through or inverting unit with which the aggressor signal line is connected, and the other aggressor signal line is connected to the other stage of the crosstalk compensation circuits through the retiming unit and the through or inverting unit with which the aggressor signal line is connected.

10. A signal transmitting circuit comprising:
a victim signal line and at least one aggressor signal line;
a retiming unit having an input terminal connected with the aggressor signal line for receiving a first input signal from the aggressor signal line, a first output terminal for outputting a current moment signal from the aggressor signal line, and a second output terminal for outputting a previous moment signal from the aggressor signal line;
an edge signal generating unit having a first input terminal for receiving the current moment signal, a second input terminal for receiving the previous moment signal, at least one first logic output terminal and second logic type output terminal, so as to acquire a rising edge signal and a falling edge signal which occur in the aggressor signal line according to the current moment signal and the previous moment signal from the aggressor signal line, wherein the first logic signal output terminal is used for outputting an indication value corresponding to the rising edge signal or an inverted signal of the rising edge signal, and the second logic type output terminal is used for outputting an indication value corresponding to the falling edge signal or an inverted signal of the falling edge signal;
at least one crosstalk compensation circuit having an input terminal receiving a second input signal from the victim signal line, the crosstalk compensation circuit comprising an input part, a first part and a second part;
wherein, the input part comprises a first type of first field effect transistor and a second type of second field effect transistor, with gate electrodes thereof being connected together to form an input terminal for connecting to the victim signal line, and drain electrodes thereof being connected together and further being connected to an output terminal of the crosstalk compensation circuit; the first part comprises at least two first branch circuits connected in parallel, each first branch circuit comprises at least one first type of third field effect transistor, a source electrode of the third field effect transistor in each first branch circuit is connected to a first common terminal, the first common terminal is connected to a power source, a drain electrode of the third field effect transistor in each first branch circuit is connected to a second common terminal and the second common terminal is connected to a source electrode of the first field effect transistor; the second part comprises a plurality of second branch circuits connected in parallel, each second branch circuit comprises at least one second type of fourth field effect transistor, a source electrode of the fourth field effect transistor in each second branch circuit is connected to a third common terminal and the third common terminal is grounded; a drain electrode of the fourth field effect transistor in each second branch circuit is connected to a fourth common terminal and the fourth common terminal is connected to a source electrode of the second field effect transistor;

wherein, gate electrodes of at least a part of the third field effect transistors and the fourth field effect transistors are connected with the first logic signal output terminal, and gate electrodes of the other part of the third field effect transistors and the fourth field effect transistors are connected to the second logic type output terminal.

11. The signal transmitting circuit according to claim 10, wherein the first branch circuits correspond to the second branch circuits one to one, the at least one third field effect transistor in the first branch circuit and the at least one fourth field effect transistor in the corresponding second branch circuit are the same in number and connection structure; in the first part and the second part, the gate electrodes of at least a part of the third field effect transistors and the fourth field effect transistors of the same number are connected with the first logic signal output terminal, and the gate electrodes of the other part of the third field effect transistors and the fourth field effect transistors are connected with the second logic type output terminal.

12. The signal transmitting circuit according to claim 10, wherein the retiming unit comprises two D flipflops connected in series, wherein an input terminal of a preceding first stage D flipflop receives the first input signal from the aggressor signal line, an output terminal of the preceding first stage D flipflop outputs the current moment signal and an output terminal of a subsequent second stage D flipflop outputs the previous moment signal.

13. The signal transmitting circuit according to claim 10, wherein the edge signal generating unit comprises an AND circuit and an NAND circuit;

the current moment signal and an inverted signal of the previous moment signal are input to two input terminals of the AND circuit respectively, an inverted signal of the current moment signal and the previous moment signal are input to two input terminals of the NAND circuit respectively, an output terminal of the AND circuit is the first logic signal output terminal and an output terminal of the NAND circuit is the second logic type output terminal; or the inverted signal of the current moment signal and the previous moment signal are input to the two input terminals of the AND circuit respectively, the current moment signal and the inverted signal of the previous moment signal are input to the two input terminals of the NAND circuit respectively, the output terminal of the AND circuit is the second logic type output terminal and the output terminal of the NAND circuit is the first logic signal output terminal.

14. The signal transmitting circuit according to claim 10, wherein the crosstalk compensation circuit further comprises:

at least one third branch circuit, the third branch circuit having at least one pair of delay elements, each pair of delay elements including a first delay element and a second delay element respectively, wherein one end of the first delay element is connected with the first common terminal, the other end of the first delay element is connected with one end of the second delay element and the other end of the second delay element is connected with the fourth common terminal; and at least one pair of a first type of field effect transistor and a second type of field effect transistor, wherein drain electrodes of the first type of field effect transistor and the second type of field effect transistor are connected together and are further connected to the output terminal of the crosstalk compensation circuit, and source electrodes of the first type of field effect transistor and the second type of field effect transistor are connected to a connection point between the first delay element and the second delay element; the first type of field effect transistor and the second type of field effect transistor are capable of being turned on or off simultaneously.

15. The signal transmitting circuit according to claim 10, wherein the first delay element and the second delay element are capacitors or field effect transistors.

16. The signal transmitting circuit according to claim 10, wherein the first type of field effect transistor is a P-type field effect transistor and the second type of field effect transistor is a N-type field effect transistor, or the first type of field effect transistor is a N-type field effect transistor and the second type of field effect transistor is a P-type field effect transistor.

17. The signal transmitting circuit according to claim 10, wherein a delay component is connected between the victim signal line and the input terminal of the crosstalk compensation circuit.

18. The signal transmitting circuit according to claim 10, wherein the victim signal line is connected to two-stage crosstalk compensation circuits connected in series; there are at least two aggressor signal lines, which are located at two sides of the victim signal line respectively, wherein one aggressor signal line is connected to one stage of the crosstalk compensation circuits through the retiming unit and the edge signal generating unit with which the aggressor signal line is connected, and the other aggressor signal line is connected to the other stage of the crosstalk compensation circuits through the retiming unit and the edge signal generating unit with which the aggressor signal line is connected.

* * * * *